United States Patent
Arnell et al.

(10) Patent No.: US 6,565,983 B1
(45) Date of Patent: May 20, 2003

(54) ELECTRICAL CONTACT ELEMENT AND USE OF THE CONTACT ELEMENT

(75) Inventors: Sylva Arnell, Vasteras (SE); Bengt Stridh, Vasteras (SE)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/856,144

(22) PCT Filed: Nov. 30, 1999

(86) PCT No.: PCT/SE99/02242

§ 371 (c)(1),
(2), (4) Date: Aug. 29, 2001

(87) PCT Pub. No.: WO00/33422

PCT Pub. Date: Jun. 8, 2000

(30) Foreign Application Priority Data

Nov. 30, 1998 (SE) .............................................. 9804119

(51) Int. Cl.⁷ .............................................. B32B 15/04
(52) U.S. Cl. ...................... 428/469; 428/615; 428/929; 428/689; 428/477.7; 428/336; 428/686; 428/646; 427/123.1; 427/123.2; 427/58; 427/96; 427/98; 427/99; 204/297.1; 204/297.07; 204/297.08; 204/297.09; 204/297.11; 204/297.12; 204/279; 204/297.13; 204/297.14; 205/789; 218/158
(58) Field of Search .......................... 427/123.1, 123.2, 427/58, 96, 98, 99; 218/158; 428/615, 929, 689, 477.7, 469, 336, 686, 646; 439/188; 204/297.1, 297.07, 297.08, 297.09, 297.11, 297.12, 297.13, 297.14, 279; 205/789

(56) References Cited

U.S. PATENT DOCUMENTS

| 3,662,745 | A | * | 5/1972 | Cosentino |
| 4,625,401 | A | | 12/1986 | Cvijanovich |
| 4,699,763 | A | | 10/1987 | Sinharoy et al. |
| 5,235,743 | A | | 8/1993 | Endo et al. |
| 5,316,507 | A | | 5/1994 | Capp |
| 5,316,508 | A | | 5/1994 | Landucci |
| 5,413,685 | A | * | 5/1995 | Ozawa et al. |
| 5,552,032 | A | * | 9/1996 | Xie et al. |
| 6,254,979 | B1 | * | 7/2001 | Drew et al. |

FOREIGN PATENT DOCUMENTS

| EP | 38 32 497 | 4/1989 |
| GB | 1 455 324 | 11/1976 |

* cited by examiner

Primary Examiner—Cynthia H. Kelly
Assistant Examiner—Tamra L. Dicus
(74) Attorney, Agent, or Firm—Oblon, Spivak, McClelland, Maier & Neustadt, P.C.

(57) ABSTRACT

An electrical contact element for electrically connecting an electric device and providing current transmission in an electric device wherein the electrical contact element comprises a metallic body, and wherein at least one contact surface, present on the body, is completely or partially coated with a friction-reducing layer. The friction-reducing layer comprises a metal salt.

18 Claims, 3 Drawing Sheets

ELECTRICAL CONTACT ELEMENT AND USE OF THE CONTACT ELEMENT

The present invention relates to an electrical contact element for electrically connecting an electric device and providing current transmission in an electric circuit. The electrical contact element comprises a metallic body, where at least one contact surface present on the body is completely or partially coated with a friction-reducing layer.

BACKGROUND ART

Electrical contact elements, such as, for example, connection and terminal devices of plug-in type, sliding contacts or stationary contacts, which are adapted for electrically connecting an electric device and providing current transmission in switchgear for low voltage, medium voltage or high voltage, in a control system or in some form of electric circuit, are preferably manufactured of copper or aluminium. A contact element may, for example, be of lamellar type, of pin type, a spiral contact element, or a device for connection to various types of internal or external busbars.

To improve the electrical and thermal properties of a contact transition while at the same time protecting a contact surface, present on the contact element, against wear and corrosion as well as ensuring the function of the contact element for a longer period of time, it is known to coat the contact element with, for example, silver or tin. However, a silver- or tin-coated contact surface, which slides against another silver- or tin-coated contact surface, exhibits a great tendency to become welded together. To avoid this problem, the silver- or tin-coated contact surfaces are therefore usually lubricated with a lubricant. For silver- or tin-coated contact surfaces, a lubricant with an oil or a fat as base is usually used. Solid lubricants, for example graphite or various types of plastics, may also be used. However, solid lubricants are poor electric conductors and are often worn off when the contact surfaces slide against each other.

Also for contact elements with an uncoated contact surface, it is desirable with reduced friction in the contact surface.

U.S. Pat. No. 5,316,507 provides an example of a contact layer with lubricating properties. A solid lubricant, graphite of a certain particle size, mixed with a powder of an electrically conductive material, for example gold, is pressed into a body which is sintered. During the sintering, the gold grains fuse and the graphite remains in cavities of the gold. The sintered body is rolled into a strip in a pluralilty of rolling steps with intermediate heat-treatment operations, the strip being used as a conductive and lubricating contact layer for contact elements. A disadvantage with the above-mentioned conductive and lubricating contact layer is that it requires a complicated and expensive manufacturing process.

One problem when using a fat- or oil-based lubricant is that it is difficult to apply an even layer of lubricant to the contact surface. Thick films of the lubricant have an adverse influence on the electrical properties and thin films of the lubricant are often worn away by mechanical influence. Another problem when using a lubricant is that it is volatile and thus contaminate other components. Still another problem is that the lubricant is sticky, which implies that it adheres to components which should not be lubricated and that it easily absorbs contaminants, for example particles of dust, which may give an increased contact resistance. The contaminants in the lubricant may also lead to the lubricant oxidizing more easily and thus becoming less durable.

One object of the invention is to achieve an electrical contact element with a friction-reducing layer without the above-mentioned disadvantages when using a fat- or oil-based lubricant for friction-reducing purposes. The friction-reducing layer shall have a low friction at the contact surfaces, a good resistance to wear and a high corrosion resistance. The friction-reducing layer shall also be simple and inexpensive to manufacture.

SUMMARY OF THE INVENTION

An electrical contact element adapted to electrically connect an electric device and provide current transmission in switchgear for low voltage, medium voltage or high voltage, in a control system or in some form of electric circuit, comprises a metallic body, preferably of copper, aluminium or an alloy based on any of these two metals. To improve the electrical and thermal properties of the contact transition while at the same time protecting a contact surface, present on the contact element, against wear and corrosion and ensuring the function of the contact element for a longer period of time, it is common practice to coat at least one of the contact surfaces present on the body at least partially with a layer of, for example, silver or tin. According to the invention, the contact element, possibly with a layer of silver or tin, is coated with a friction-reducing layer comprising a metal compound, preferably a metal salt, as, for example, a metal halogenide or a metal sulphide. Examples of metal halogenides are, for example, silver halogenide, tin halogenide or copper halogenide. Examples of silver halogenides are silver iodide, silver chloride or silver bromide. Corresponding halogenides also exist for copper and tin. The friction-reducing layer has a thickness which is in the interval of from 0.001 $\mu$m to 1000 $\mu$m and preferably is smaller than 5 $\mu$m.

A contact element according to the invention exhibits a reduced friction for the contact surfaces, an improved resistance to wear, and an increased corrosion resistance of the contact surfaces compared with a non-coated silver layer or tin layer. It has proved, for example, that the friction at the contact surfaces is considerably lower for the coating of the metal salt, such as the metal halogenide or the metal sulphide, compared with the friction for a layer of, for example, tin or silver on the contact surface. In case of low friction at the contact surfaces, the operation of the contact element is facilitated and enables the use of higher contact forces. A low friction at the contact surfaces also results in increased resistance to wear, which leads to improved electrical and thermal properties and increases the expected service life.

The coating of the metal salt, such as the metal halogenide or the metal sulphide, is carried out, for example, electrolytically directly on the metal body of, for example, copper or aluminium, or after the metallic body has become silver-plated or tin-coated. The coating of the metal salt is also obtained by dipping the contact element into a solution comprising at least one of the following ions: chloride, bromide, iodide or sulphide. The halogen or the sulphide reacts with the metal at the contact surface and forms the layer of the metal salt.

Another possible coating method is evaporation. During evaporation, the contact element is placed in a closed chamber and a gas comprising at least one of the halogens or the sulphide is released into the chamber. The halogen or the sulphide reacts with the surface of the contact element and forms a solid compound of metal halogenide or metal sulphide on at least part of the contact surface.

A further example of a coating process which may be used is CVD (Chemical Vapour Deposition). In the CVD process, the material with which the whole of, or parts of, the contact surface is to be coated is evaporated. By a chemical reaction on or in the vicinity of that surface which is to be coated, a solid layer is formed on the surface. By means of the CVD process, the layer is given a uniform thickness with a low porosity.

One advantage of coating the contact surface with a layer of a chemical compound as metal halogenide or metal sulphide, compared with using a fat- or oil-based lubricant, as according to the prior art, is that the layer with the metal halogenide or the metal sulphide has a longer durability than the layer with the fat- or oil-based lubricant. Another advantage is that the contact element is lighter to handle after the coating with the metal halogenide or the metal sulphide than after the coating with the fat- or oil-based lubricant. The fat- or oil-based lubricant is volatile and easily creeps to surfaces which should be free from lubricant. Additional advantages of the layer of the metal halogenide or the metal sulphide are that a more uniform layer may be obtained and that the layer has better adhesion than the layer of the fat- or oil-based lubricant.

DESCRIPTION OF THE PREFERRED EMBODIMENTS

Figure 1:
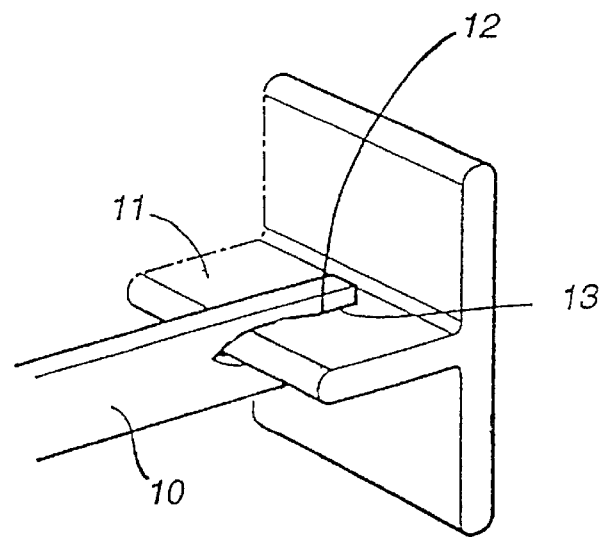
FIG. 1 shows an electrical contact element of plug-in type.

FIG. 1 shows a contact device comprising an electrical contact element of plug-in type, in which contact surfaces slide against each other in connection with a first contact element 10 in the form of a resilient jaw being adapted to be connected to a second contact element 11 in the form of a contact rail. The first contact element 10 is applied to the contact rail 11 and bears, in contacted state, clamped with at least one contact surface 12 against at least one contact surface 13 present on the other contact element 11.

The electrical contact element 10 comprises a metallic body, preferably of copper, aluminium or an alloy based on any of these two metals. According to the invention, at least one of the contact surfaces, designated 12 or 13, is completely or partially coated with a friction-reducing layer comprising a metal salt, as a metal halogenide or a metal sulphide. Examples of metal halogenides are, for example, silver halogenide, tin halogenide or copper halogenide. Examples of silver halogenides are silver iodide, silver chloride and silver bromide. The friction-reducing layer has a thickness which is in the interval of from 0.001 $\mu$m to 1000 $\mu$m, and preferably the thickness of the friction-reducing layer is smaller than 5 $\mu$m. In an especially preferred embodiment, the thickness of the layer is smaller than 1 $\mu$m.

There are also other types of contact rails and contact elements; for example, the first contact element may be adapted to be inserted into a U-shaped contact rail so as to be clamped, in contacted state, with its contact surfaces against the contact surfaces of the U-rail in the U-shaped slot.

Figure 2:
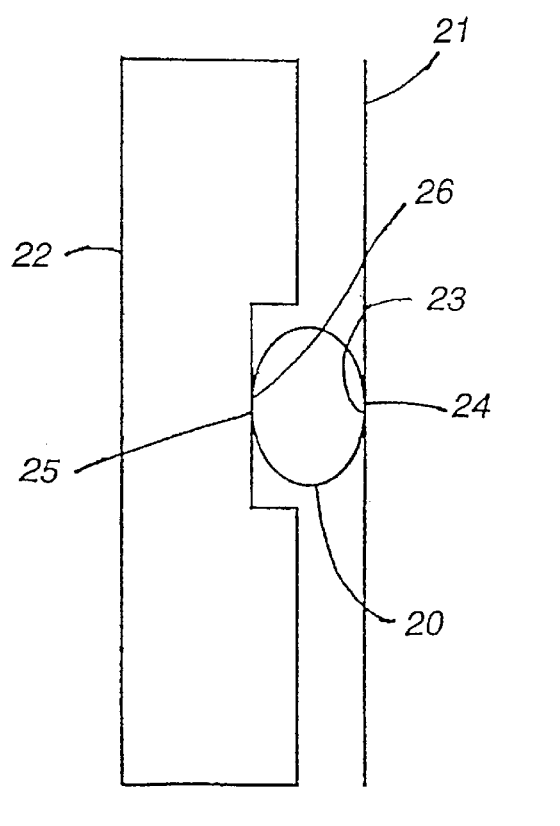
FIG. 2 shows, in a section, an electrical contact element of spiral contact type.

FIG. 2 shows another example of a contact device in which it is advantageous to coat at least one of the contact surfaces with a friction-reducing layer according to the invention. More precisely, FIG. 2 shows a spiral contact element where a first contact element 20, in the form of a resilient annular body, such as a ring of a spiralized wire, is adapted to connect and maintain electrical contact between a second contact element 21, such as an inner sleeve or a pin, and a third contact element 22, such as an outer sleeve or a tube. The first contact element 20 is, in contacted state, compressed such that at least a first contact surface 23 of the first contact element 20 will be clamped against a contact surface 24 of the second contact element 21 and that at least a second contact surface 26 of the first contact element 20 will be clamped against at least one contact surface 25 of the third contact element 22. According to the invention, at least one of the contact surfaces 23, 24, 25, 26 is completely or partially coated with the friction-reducing layer comprising a metal salt, as, for example, a metal halogenide or a metal sulphide. The spiral contact element is used, for example, in an electric circuit breaker in a switchgear unit.

In a preferred embodiment, the contact surfaces 12, 13, 23, 24, 25, 26 are at least partially silver-plated or tin-coated, and the silver or tin layer is in its turn coated with the friction-reducing layer comprising a metal salt, such as a silver salt or a tin salt. The silver salt is, for example, a silver halogenide or a silver sulphide.

For coating the contact surface with the metal salt, as for example the metal halogenide or the metal sulphide, a number of possible coating methods are available. Among these may be mentioned electrolytic coating, evaporation or dipping the contact surface into a solution comprising at least one of the following ions: iodide, chloride, bromide or sulphide.

In a particularly preferred embodiment, the whole of or parts of the contact surface 12, 13, 23, 24, 25, 26 is/are silver-plated, and the silver-plated contact surface in its turn coated with a layer of silver iodide with a thickness smaller than 5 $\mu$m, preferably smaller than 1 $\mu$m. The layer of silver iodide is, in one preferred embodiment, suitably made with the electrolytic coating method.

Figure 3:
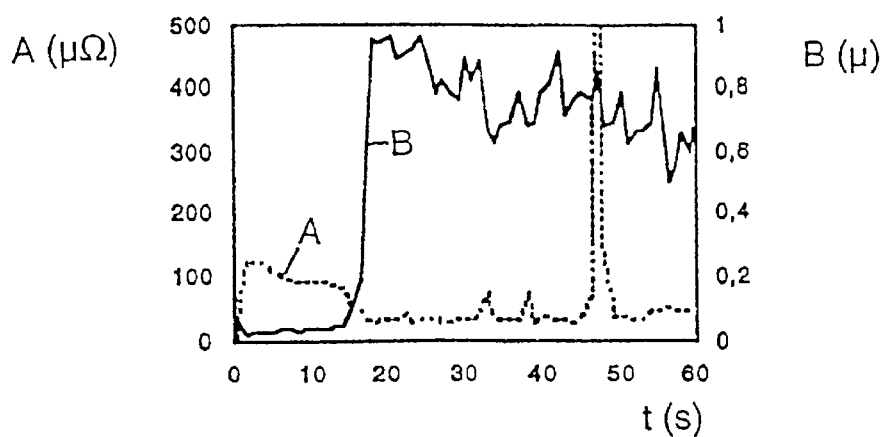
FIG. 3 shows a diagram of how contact resistance, curve A, and friction coefficient, curve B, change with time for a contact with a coating of standard silver.
Figure 4:
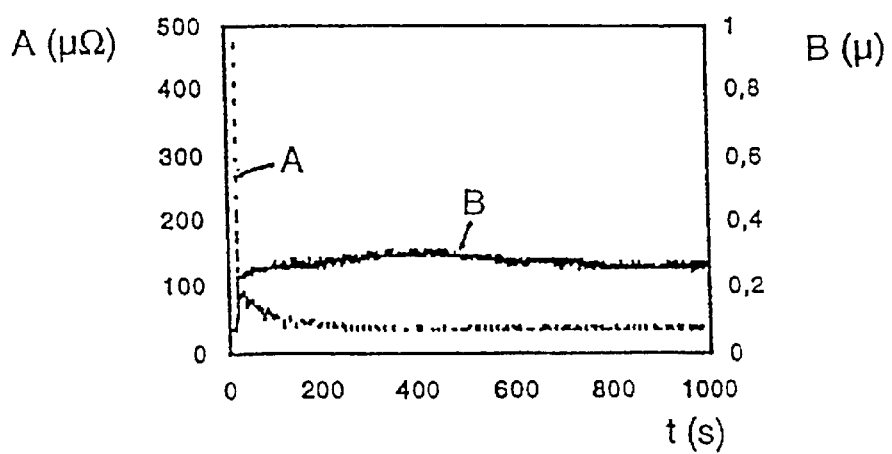
FIG. 4 shows a diagram of how contact resistance, curve A, and friction coefficient, curve B, change with time for a contact with a coating of standard silver and a friction-reducing layer of silver iodide.

FIGS. 3 and 4 show how contact resistance, curve A, and friction coefficient, curve B, change with time, t, for a friction experiment for a contact element coated with standard silver and a contact element where the layer of standard silver is coated with a layer of silver iodide, respectively. During the experiment in FIG. 3, the contact element is coated with 15–25 $\mu$m of standard silver and during the experiment in FIG. 4, the contact element is coated with 15–25 $\mu$m of standard silver which in its turn is coated with a 7000 Å thick layer of silver iodide. During the two experiments in FIGS. 3 and 4, a contact force of 20 N was used. A comparison between FIGS. 3 and 4 shows that the friction coefficient B becomes considerably lower if the layer with standard silver is coated with silver iodide according to the invention.

Figure 5:
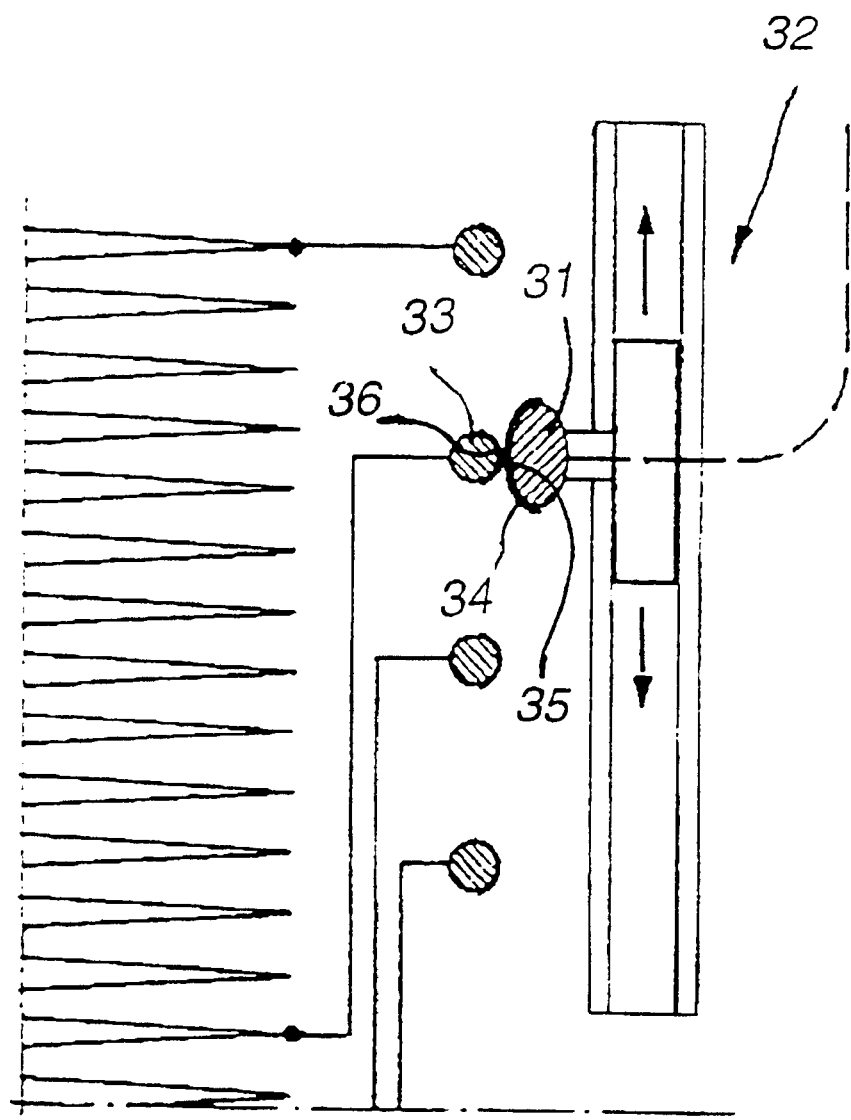
FIG. 5 schematically shows a sliding contact element in a tap changer for a transformer.

FIG. 5 schematically shows a sliding electrical contact element according to a further preferred embodiment of the invention. A first contact element 31 is arranged as a movable part of a tap changer 32 for a transformer. The contact element 31 is adapted to slide in electrical contact along the winding contact 33 on the secondary winding of the transformer to obtain voltage of the desired level from the transformer. A friction-reducing layer 34 comprising metal halogenide or metal sulphide according to the invention is arranged on the contact surface 35 of the first contact element 31 and/or on the contact surface 36 of the winding contact 33. According to an especially preferred embodiment, the friction-reducing layer 34 comprises silver iodide. The first contact element 31 is easily movable along the winding contact 33 while at the same time a low contact resistance is maintained.

In addition to the examples of contact devices described above, several types of contact devices are available in which it is advantageous to coat the whole of, or parts of, the contact surface of the contact element with a metal halogenide or a metal sulphide according to the invention. An example of such a contact device is a contact device with an intermediate contact element in the form of a cylindrical sleeve comprising a number of resilient elements or a cylindrical sleeve, resilient in the radial direction, adapted to electrically connect, contact and provide current transmission between a first contact element, an inner sleeve or a pin, and a second contact element, an outer sleeve or a tube, whereby the resilient sleeve or the resilient elements bear, in clamped state, against the contact surfaces of the two sleeves.

Another example is a contact device in which a first contact element, for example a resilient sleeve with an essentially rectangular cross section, in contacted state is supplied with a second contact element, for example a flat pin.

Still another example of a type of contact is a contact device with a first contact element in the form of a resilient cylindrical sleeve which, in contacted state, is applied to a second contact element in the form of a solid cylindrical pin or an inner sleeve, whereby the resilient force of the sleeve causes it to bear, in clamped state, with its contact surface against the contact surface of the pin. This last type of contact also comprises sleeves with a plurality of fingers adapted to form a cylindrical sleeve. When a pin or an inner sleeve is applied to the sleeve, the fingers will bear, in clamped state, against a contact surface on the sleeve or the pin.

To further improve the friction, the mechanical, thermal and electrical properties of the friction-reducing layer, it is possible to dope the friction-reducing layer with one or more substances, for example various metals. The quantity of dopants should not exceed 20 per cent by weight of the total weight of the friction-reducing layer.

A contact element coated with a friction-reducing layer according to the invention is intended to be used in electrical apparatus and installations at low, medium or high voltage.

The friction-reducing layer according to the invention is also intended for coating of electrical contact elements with a surface other than silver, tin, copper, aluminium or alloys thereof.

What is claimed is:

1. An electrical contact element for electrically connecting an electric device and providing current transmission in an electric circuit, wherein the electrical contact element comprises a metallic body, and wherein at least one contact surface, present on the metallic body, is completely or partially coated with a friction-reducing layer comprising a metal salt, said friction-reducing layer having a thickness of 0.001 $\mu$m to 1,000 $\mu$m.

2. A contact element according to claim 1, wherein the metal salt is a metal halogenide.

3. A contact element according to claim 1, wherein the metal salt is a metal sulphide.

4. A contact element according to claim 2, wherein the metal halogenide comprises at least one of the following metals: silver, tin or copper.

5. A contact element according to claim 4, wherein the metal halogenide comprises at least one of the following halogenides: iodide, chloride or bromide.

6. A contact element according to claim 3, wherein the metal sulphide comprises at least one of the following metals: silver, tin or copper.

7. A contact element according to claim 1, wherein the metallic body is at least partially coated with a layer of a silver-based material, wherein the layer of the silver-based material is arranged between the metallic body and the friction-reducing layer.

8. A contact element according to claim 1, wherein the metallic body is at least partially coated with a layer of a tin-based material, wherein the layer of the tin-based material is arranged between the metallic body and the friction-reducing layer.

9. A contact element according to claim 1, wherein the metallic body comprises copper or aluminum.

10. A contact element according to claim 1, wherein the friction-reducing layer has a thickness which is smaller than 5 $\mu$m.

11. A contact element according to claim 1, wherein the friction-reducing layer has a thickness which is smaller than 1 $\mu$m.

12. A contact element according to claim 1, wherein the friction-reducing layer is doped with one or more substances.

13. A contact element according to claim 1, wherein the friction-reducing layer is applied by means of an electrolytic method.

14. A contact element according to claim 1, wherein the friction-reducing layer is applied by means of a chemical method.

15. A contact element according to claim 1, wherein the friction-reducing layer is applied by means of evaporation technique.

16. A method comprising coating a tap changer in a transformer with the friction-reducing layer according to claim 1.

17. The tap changer produced by the method of claim 16.

18. A contact element according to claim 14, wherein the friction-reducing layer is applied by dipping into a chemical solution of the metal salt.

\* \* \* \* \*